United States Patent [19]

Talbott et al.

[11] Patent Number: 5,357,440
[45] Date of Patent: Oct. 18, 1994

[54] METHOD AND APPARATUS FOR AIDING SYSTEM DESIGN

[75] Inventors: Marvin T. Talbott, Plano; Henry L. Burks, Dallas; Richard W. Shaw, Plano; Michael Amundsen; Katherine K. Hutchison, both of Dallas; Donald D. Strasburg, Plano, all of Tex.

[73] Assignee: Texas Instruments Incorporated, Dallas, Tex.

[21] Appl. No.: 966,128

[22] Filed: Oct. 23, 1992

Related U.S. Application Data

[63] Continuation of Ser. No. 661,356, Feb. 26, 1991, abandoned.

[51] Int. Cl.$^5$ .............................................. G06F 15/20
[52] U.S. Cl. ................................. 364/467; 364/474.24; 364/488; 364/512; 395/919
[58] Field of Search .......................... 395/919; 364/488

[56] References Cited

U.S. PATENT DOCUMENTS

| | | | |
|---|---|---|---|
| 4,862,376 | 8/1989 | Ferriter et al. | 364/468 |
| 4,918,614 | 4/1990 | Modarres et al. | 364/490 |
| 5,050,091 | 9/1991 | Rubin | 364/488 |

OTHER PUBLICATIONS

Reinhart et al., "Automated Design for Maintainability," Proc. IEEE 1990 National Aerospace and Electronics Conf., May 1990, 1227–1232.
Bellehsen et al., "A System Testability Top-Down Apportionment Method," IEEE Systems Readiness Technology Conf., Sep. 1990, 451–463.
Horak, W.; "Office Document Architecture and Office Document Interchange Formats: Current Status of International Standardization", IEEE Computer, Oct. 1985, 50–60.
Nierstrasz et al., "Integrated Office Systems" from object-oriented concepts, databases, and applications, ACM press, 1989, 199–212.
Kim, W., "Architectural Issues in Object-Oriented Databases", Jour. Object-Oriented Programming, vol. 2(6) 1990, 29–38.
Ramamoorthy et al., "The Evaluation Support Environment System", IEEE Trans. Software Engineering, vol. 16(11), Nov. 1990 1225–1234.
Defense Systems Management College, System Engineering Management Guide, 1982, Chapts. 1–9,11.
Foo et al., "Databases and Cell-Selection Algorithms for VLSI Cell Libraries", IEEE Computer, Feb. 1990, 18–30.
Stelzner et al., "The SimKit System: Knowledge-Based Simulation and Modeling Tools in KEE", Intelli, Corp., Inc., 1987.
"Model-Based Reasoning in the KEE and SimKit Systems" from Intelli News, vol. 2(2) Aug. 1986, Intelli Corp. Microsoft Corporation, Microsoft Word for Windows User's Reference, 1988, pp. 197–200.
Packet from Perceptics Corp., entitled "Knowledge Shaping An Alternative to Rule-Based Expert Systems", by Urba et al.
Computer Technology Review, Winter, 1988; "What is Knowledge Shaper TM" and Benchmark Timing Data.
"Concurrent Engineering" by Babish et al, Electronic Progress, vol. XXX No. 1, 1990, Raytheon Company, pp. 26–32.
Article and Associated Product Brochure entitled "Requirements Driven Development Executive Overview," Accent Logic Corporation, Dec. 1989.

(List continued on next page.)

Primary Examiner—Robert W. Downs
Attorney, Agent, or Firm—W. Daniel Swayze, Jr.; Leo N. Heiting; Richard L. Donaldson

[57] ABSTRACT

A method and apparatus are provided for aiding system design with a computer. The system is decomposed into a plurality of objects. The objects may have a parent-child hierarchical relationship wherein one or more of the child objects each define a portion of a parent object. A plurality of text files are generated. Information links may be generated between the objects and the text files on a plurality of different hierarchical levels, so that each object is associable with multiple ones of the text files.

8 Claims, 9 Drawing Sheets

OTHER PUBLICATIONS

Technical paper, "The Embedded Computer Design Process a New Perspective", E. H. Warshawsky, JRS Research Laboratories Inc., Jun. 1, 1989, pp. 1-11.
Packet of articles and Product Brochures by Integrated Systems, Inc., 1990.
Packet of Product Brochures by Codre, Jan., 1990.
Product Brochure, "Foresight", by Athena Systems Incorporated, Mar., 1989, pp. 1-23.
Packet of Product Brochures by EEsof, Inc., 1988.
Packet of Product brochures by Gateway Design Automation Corporation, 1989.
Brochure by ICAD, Incorporated, "The ICAD System Knowledge-aided Engineering Automation", 1990.
Packet of Product Brochures by i-Logix, Inc., 1988.
Packet of Product Brochures by Interactive Development Environments, 1988.
Packet of Product Brochures by Mentor Graphics, 1987-1989.
Packet of Product Brochures by ParcPlace Systems, 1989.
Packet of Brochures by Ready Systems, 1989.
Packet of Brochures by Scientific and Engineering Software, Inc., 1989.
Brochure, "The AISLE Family of ADA Design Tools", by Software Systems Design, Inc., Jul., 1988.
Brochure, "Snyapsys ASIC Partnerships" by Synopsys, Jun., 1989.
Packet of Brochures by Systematica, Limited, 1989.
Packet of Brochures by Teledyne Brown Engineering, 1990.
Packet of Brochures by Pacific Numerix, 1987.
Packet of Brochures by VIEW logic Systems, Inc., 1989.
Brochure, "Case Tools for Software Industrialization" by Verilog USA, 1990.
Packet of Brochures by Comdisco Systems, Inc., 1990.
Brochure, "Methodology Overview" by Texas Instruments Incorporated, 1989.

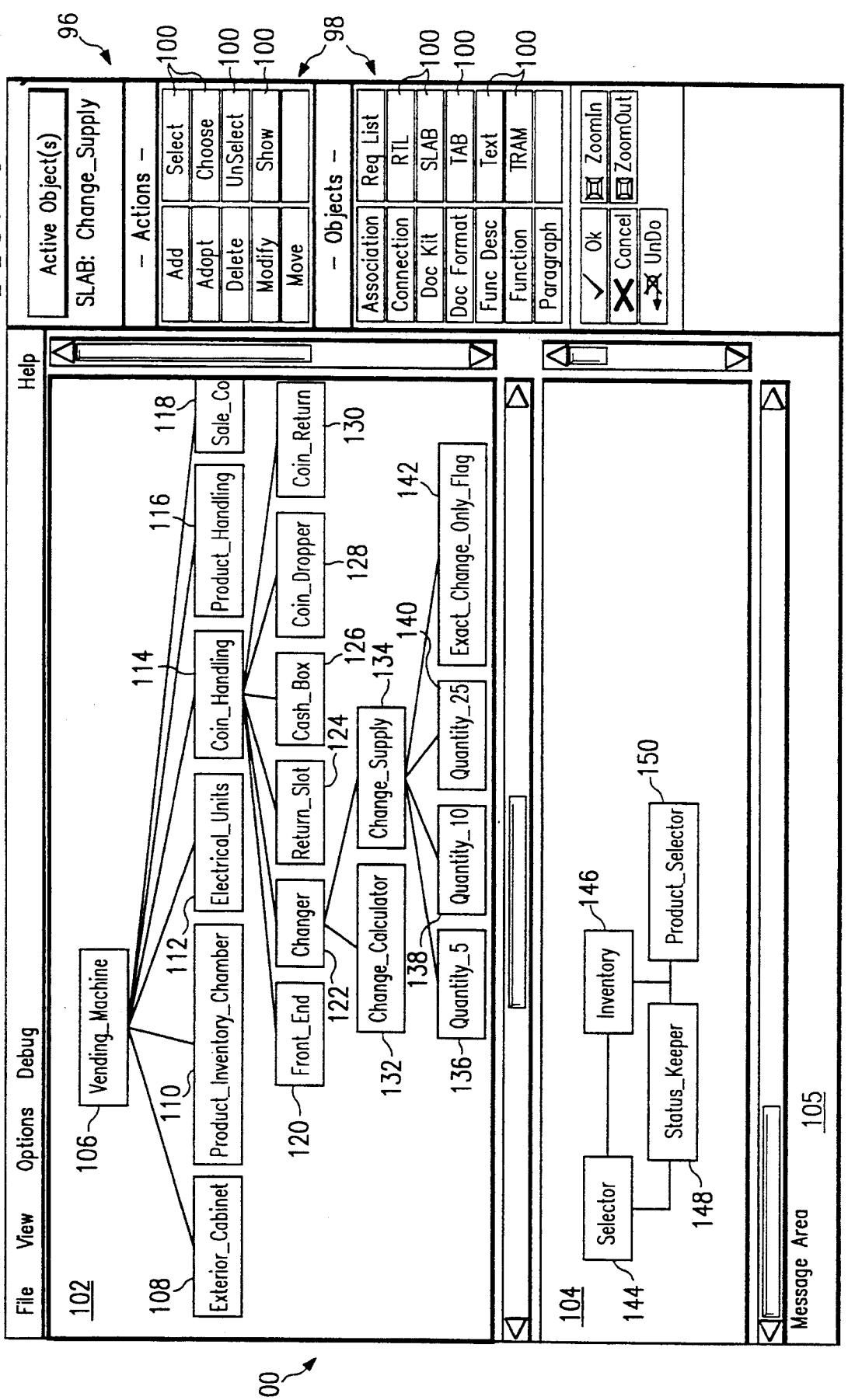

FIG 7a

Modify TAB — 152, 88

- TAB Name: Weight — 156
- on SLAB: Vending Machine — 158
- TAB Units: pounds — 160
- Goal Value: 5000 — 162
- Min – Max: 6000 / 7000 — 164, 166
- TAB RTLs: — 168

Actual Values — 170

- Value: 4550 — 172
- Confidence: Global default — 176
- ◇ Children: — 189, 174
- SUM — 180
- of 6 Children: — 178
- Assigned: 0.000000 — 184, 182 Model specification
- Equation: 0.000000 — 186 Physical
- 188

[OK]  [Cancel]  [Help]

FIG 7b

Modify TAB — 154, 88

- TAB Name: Capacity — 156
- on SLAB: Product_Inventory_Chamber — 158
- TAB Units: cans — 160
- Goal Value: 550.000000 — 162
- Min – Max: 400.000000 / 700.000000 — 164, 166
- TAB RTLs: — 168

Actual Values — 170

- Value: 0.000000 — 172
- Confidence: Global default — 176
- Children: — 174
- SUM — 180
- of 0 Children: — 178
- Assigned: 0.000000 — 184, 182 Model specification
- 0.000000 — 186 Physical
- ◇ Equation: ightACT * 12 / 2.1 * .width * 12 / — 189, 188

[OK]  [Cancel]  [Help]

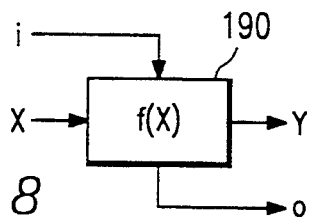

FIG. 8

FIG. 9a

Modify Text Fragment

Name: [Chamber] ~194    Numeric ID: [ ] ~196

Description:
[Product Inventory Chamber] ~198

Keywords:
[inventory sensors] ~200

Attached To:
[/Vending_Machine,Product_Inventory_Chamber] ~202

Referencing Documents:
[DOCT/FService;3
 ] ~204

Text:

This component acts as the local warehouse for the beverage cans of the different product types. It also houses the cash boxes. The parameters that govern it's design include: a) the number of bins for product types dispensed by the machine, b)the capacity which conforms to the maximum total loaded weight limit and the minimum can storage, c)the strength needed to handle a maximum load, d)the configuration needed to support the temperature range maintenance, and e)the use of gravity, only, to feed the dispenser. The chamber consists of a single, cast aluminum piece with bin openings in the front to load the beverage cans, vents in the back to handle cool air flow, mounting brackets, and ribbing to increase structural integrity. Another aluminum panel is hinged to the left front vertical edge of the chamber and is used to seal the cooling environment of the unit providing a lock-controlled access door for the maintenance personnel.

If the chamber needs replacing, quick release bracket fasteners make it easy to remove it and install another after detaching and reattaching sensors.

~206

[ OK ]    [ Cancel ]    [ Help ]

Format/Administrative Block For:

FService — 210

Document Title: FIELD SERVICE MANUAL-FIRST DRAFT — 212
Document Type: Manual — 214
Symbolic Name: — 216
Publisher: Texas Instruments, Inc. — 218
Contract #: Chamber — 220
Customer: Patent Office — 222
Revision: None — 224    Date: Thu Jan 10,1991 — 226
Classification: Unclassified — 228
Headers-Left: ____    Right: ____
Footers-Left: ____ — 230    Right: ____ — 230

Table of Contents (y/n): y          List of Appendices (y/n): n
Index (y/n): y — 232                List of Figures (y/n): n — 232
Acronym Section (y/n): n            List of Tables (y/n): n — 232
Ref. Document Section (y/n): n — 232

[ OK ]    [ Cancel ]    [ Help ]

FIG. 9b   ↘ 208

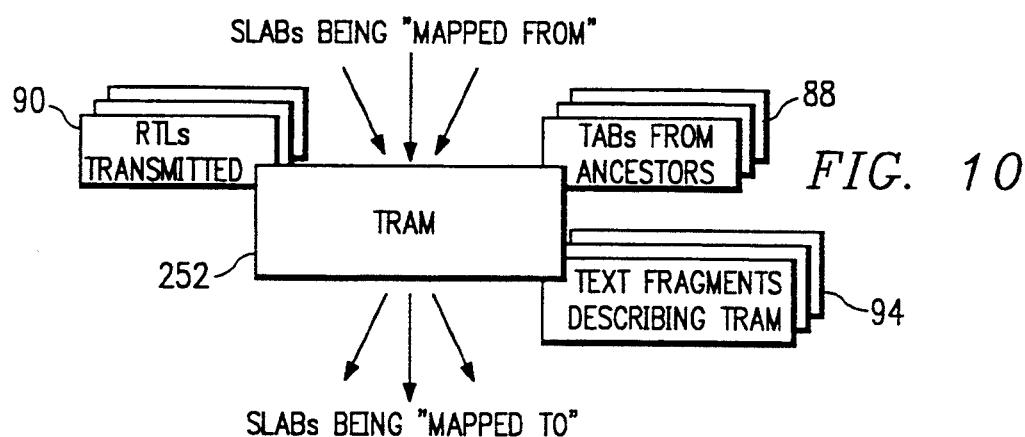

Document Template Editor for:

FService

Document Title: FIELD SERVICE MANUAL—FIRST DRAFT
Revision: None          Date: Thu Jan 10, 1991
Classification: Unclassified

Document Structure/Content

```
{DOCUMENT START}
1. Introduction
    /LOC (intro)
2. Exterior Cabinet
    /REF (0.1;ExterCab)
3. Product Inventory Chamber
    /REF (0.2;Chamber)
4. Electrical Units
    /REF (0.3;ElecUnits)
4.1 Cooling Compressor
    /REF (0.3.1;Compres)
    /REF (0.3;VendAcme)
4.2 Temperature Sensor
    /REF (0.3.2;TempSens)
    /REF (0.3;VendXYZ)
4.3 Temperature Regulator
    /REF (0.3.3;Tempreg)
    /REF (0.3;VendXYZ)
4.4 Lights
    /REF (0.3.4;Lights)
5. Coin Handling
    /REF (0.4;CoinHand)
    /REF (0.3;VendLocal)
6. Product Handling
    /REF (0.5;ProdHand)
7. Sales Controller
    /REF (0.6;SalesContr)
    /REF (0.3;VendAIDS)
{DOCUMENT END}
```

[Quit]   [Expand]   [Collapse]   [Help]

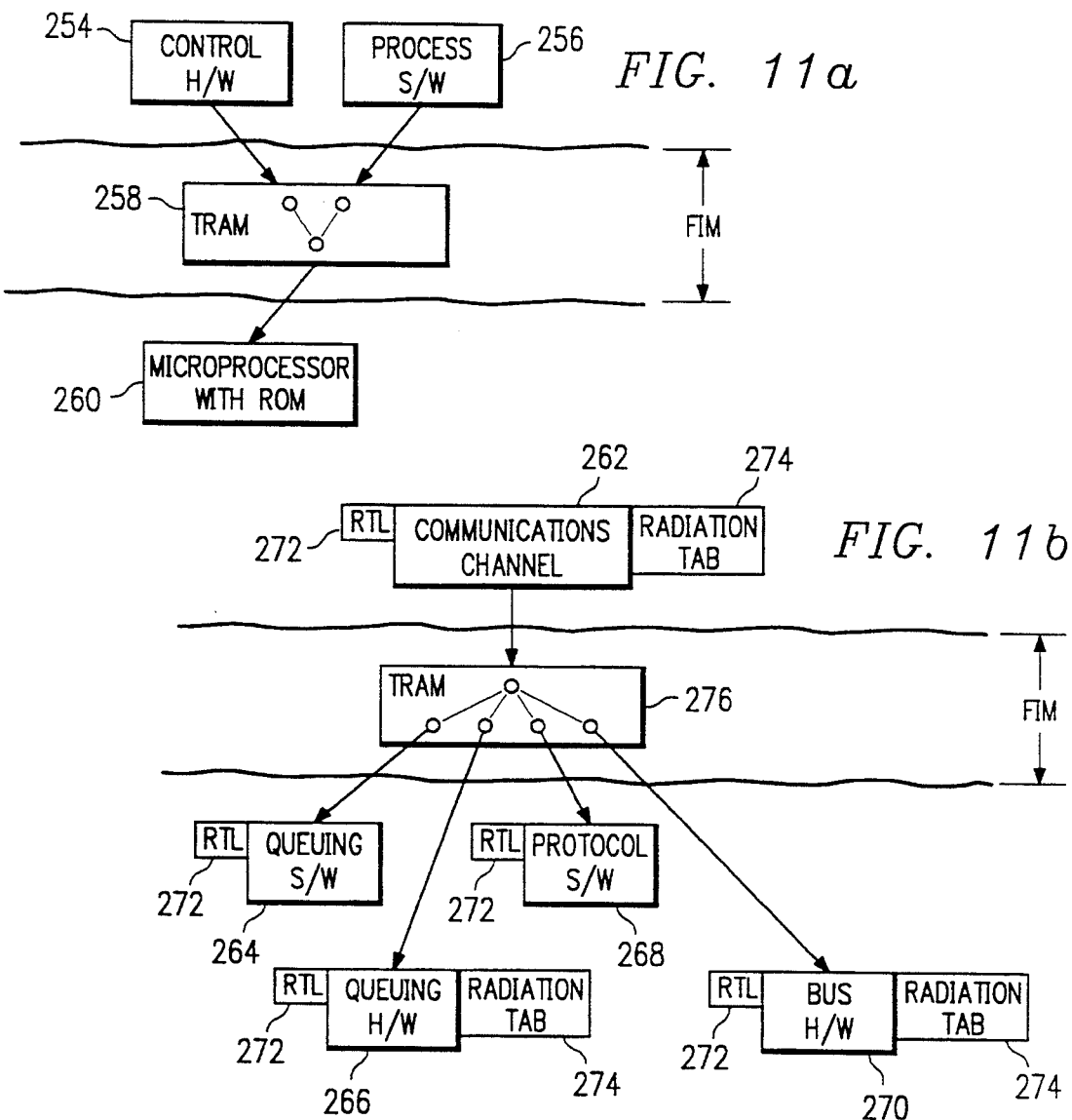

METHOD AND APPARATUS FOR AIDING SYSTEM DESIGN

This application is a continuation of application Ser. No. 07/661,356, filed Feb. 26, 1991, now abandoned.

RELATED PATENT APPLICATIONS

This patent application is related to U.S. patent application Ser. No. 08/075,844, entitled "Computer Tool for System Level Design"; U.S. patent application Ser. No. 07/661,042, entitled "Method and Apparatus for System Design"; and U.S. patent application Ser. No. 07/965,984, entitled "Method and Apparatus For Tracking Allocatable Requirements", all filed concurrently herewith.

TECHNICAL FIELD OF THE INVENTION

This invention relates in general to computers systems and more particularly, to a computer system automation tool for system level engineers.

BACKGROUND OF THE INVENTION

System engineering concerns the conceptualization and construction of complex systems. As such, it is an important part of any major project. The system engineering commences at the initial stages of a project, and continues throughout the project life cycle, thereby having a great impact on the successful completion of the project.

To aid the system engineer, a multitude of computer tools have been designed. One word which is the key to understanding these tools is "system". Webster's generic definition describes a system as "a regularly interacting or independent group of items forming a unified whole." "Systems" range from extremely high-level concepts such as "a motorized vehicle for individuals" to the low-level, such as "a drive train."

Although the term "system" is an overloaded term which can have far-reaching implications, an important element to consider is the different types of support tools which are appropriate at different system levels. Current software (e.g., CASE—Computer Aided Software Engineering) and hardware (e.g., CAE—Computer Aided Engineering) design tools are directed toward efficiency of use in a specific environment, rather than over the broad range of system levels. As such, several different tools are necessary at the different system levels, which complicates communication of necessary information between system levels. Further, the specific tools place different operational requirements on the user, thereby reducing the efficiency of using the programs.

Therefore, a need has arisen in the industry for a system engineering tool which provides engineering support over a wide range of system levels.

SUMMARY OF THE INVENTION

In accordance with the present invention, a method and apparatus for aiding system design with a computer is disclosed which substantially overcomes problems associated with prior system engineering tools.

In a first aspect of the present invention, a system is decomposed into a plurality of objects. Some of the objects have a parent-child hierarchical relationship, wherein one or more child objects each define a portion of a parent object. Information links are generated between the objects on a plurality of different hierarchical levels. In other aspects of the present invention, the information links include text files, which may be linked together to automatically produce a document. Further, the information links may include allocatable requirements apportioned among the objects, which may be traced across hierarchical levels. The information links may also include structural requirements which may be traced across hierarchical levels. The plurality of objects may include first and second sets of objects and information links describing the relationships between the sets of objects may be generated. A matrix of interrelations may be maintained by the present invention.

The present invention provides a design environment which provides a comprehensive view of the system over a broad range of system levels. Different system levels are interrelated both upwardly from the implementation details and downwardly from the broad system goals. By providing a tool which operates over a broad range of system levels, a consistent operating environment may be provided.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a user interface showing hierarchical decomposition of a requirements definition;

FIGS. 7a–b illustrate a use for defining a technical allocation budget (TAB);

FIG. 8 illustrates a block diagram of an executable SLAB;

FIGS. 9a–d illustrate menus used for text fragments and automatic document generation;

FIG. 10 illustrates a block diagram of a transitional mapping (TRAM);

FIGS. 11a–b illustrate common uses of TRAMs; and

FIG. 12 illustrates an implementation of a mapping of regional TRAMs and requirements (MORTAR).

DETAILED DESCRIPTION OF THE INVENTION

The preferred embodiment of the present invention and its advantages are best understood by referring to FIGS. 1–12 of the drawings, like numerals being used for like and corresponding parts of the various drawings.

Figure 1:
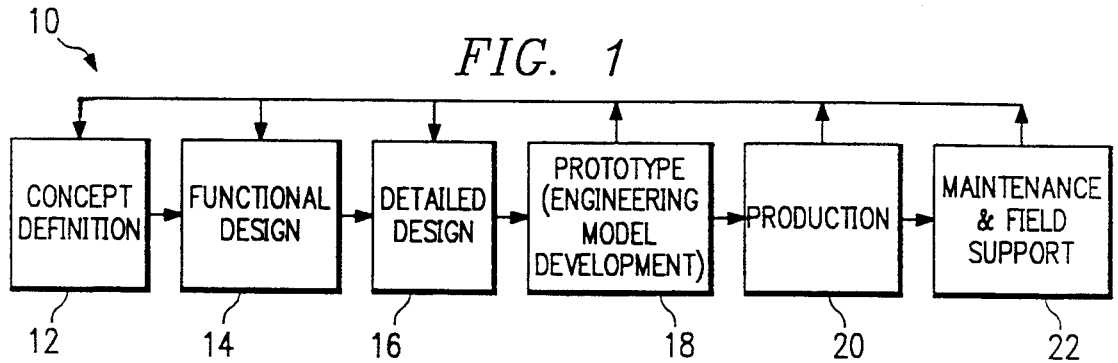
FIG. 1 illustrates a block diagram of project functions performed by a system engineer.

FIG. 1 illustrates a block diagram showing the project functions performed by system engineers. The project 10 begins with concept definition stage 12, which broadly states the goals of the project. Based on the output from the concept definition stage 12, a functional design 14 is generated. From the functional design phase 14, a detailed design is developed in block 16. In block 18, a prototype is developed. After the prototype is developed, production of the units begins in block 20. After production 20, maintenance and field support continue in block 22. As can be seen by the block diagram of the project 10, there is continuous feedback from the prototype production and maintenance blocks 18-22 which is incorporated in the concept definition, functional design and detailed design blocks 12-16.

Figure 2:
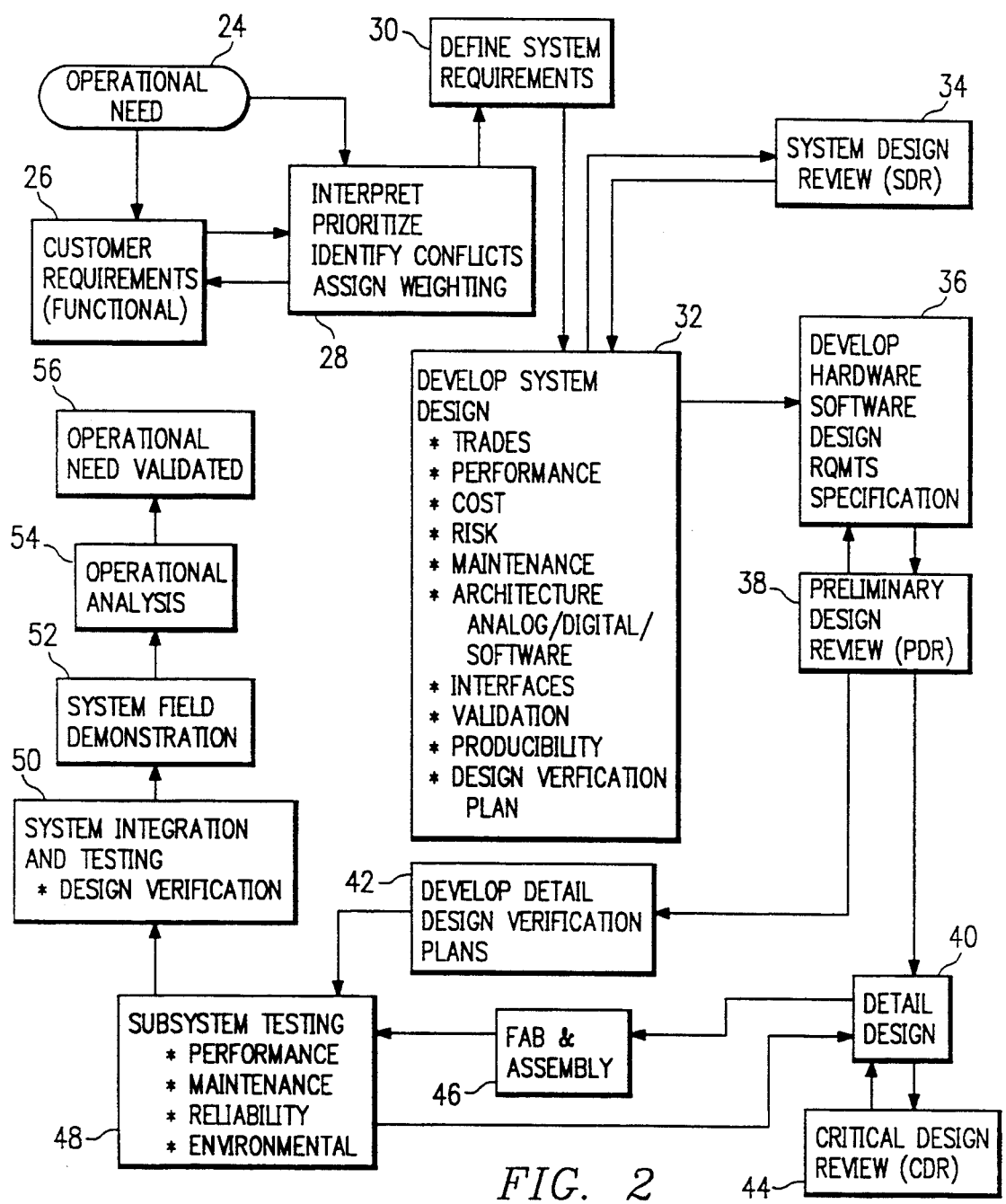
FIG. 2 illustrates a more detailed block diagram of a typical system engineering cycle.

FIG. 2 illustrates a more detailed block diagram of a typical system engineering cycle. The system engineering cycle begins in block 24 with the identification and evaluation of the operational needs of the system under consideration. These needs are combined with the customer requirements in block 26 which are interpreted and prioritized in block 28. This interpretation may be validated with the customer, after which the system requirements are designed in block 30.

The system requirements defined in block 30 are used to develop a system design. The system design includes documentation on design tradeoffs, estimated performance, estimated costs, risks, maintenance plans, validation, and producibility. Further, the system design includes a proposed architecture, breaking down the system into logical groups. For example, in an electronics system, the architecture might be broken down into analog, digital and software groups. If applicable, interfaces to other components must be defined. The information generated in the system design block 32 is reviewed in the system design review block 34. This is an interactive process in which the system design is refined until an acceptable design has been generated.

Once an acceptable design is generated, a design requirements specification is generated in block 36. The design requirements specification is reviewed under a preliminary design review block 38. The specification 36 is refined until accepted.

After the preliminary design review 38, a detailed design is developed in block 40 and a detailed design verification plan is developed in block 42. The detailed design 40 is refined until accepted by a critical design review 44. After accepted, the detailed design 40 is taken to fabrication and assembly 46. The system is tested in block 48 for performance, maintenance, reliability and environmental factors. Information from the system testing 48 is used to refine the detailed design in block 40.

Once testing is complete, system integration and testing is performed in block 50, the system is demonstrated in block 52, an operational analysis is performed in block 54 and the operational need (block 24) is validated in block 56.

As the cycle progresses from the concept stage to the design stage, the numerous ancillary requirements often become apparent. These requirements are often written down in multiple places or carried in the heads of one or more people. Maintaining a consistent set of requirements among these documents and humans is a difficult problem. The system engineer continues to refine information, breakdown requirements and define the functional structure of the solution. System level requirements need to flow downward in the hierarchy to ensure that the delivered system meets its requirements. Likewise, implementation details need to flow upward in the hierarchy in order to allow the system engineer to further refine the definition of the functional structure of the solution.

REQUIREMENTS

A large part of the system engineer's job involves information management. System level requirements are some of the most important pieces of information to be managed. "Requirements" is a generalized term which is often loosely applied to a number of different types of system level issues. The present invention provides support for four basic types of Requirements: Structural, Compliancy, Allocatable and Supplemental.

"Structural" Requirements are statements in the specification which describe a functional structure that must be embodied in the final product. An example of a Structural Requirement would be "the database receives information through a bank of twenty-four modems."

"Compliancy" Requirements are global compliancy statements relative to the system being specified. For example, a specification might require that "all software development shall be done in Pascal," or "all electronic hardware must be radiation hardened."

"Allocatable" Requirements are characterized by quantifiable measures. Quantities are typically described in such terms as weight, size, cost, pressure, temperature, speed, power, memory and process capacity and so on. These requirements typically impose limits on contributing components of the product. Each of these requirements may be thought of as part of the "technical budget." For example, if a system is allotted "twenty-five watts of power and must weigh no more than two pounds", then the weight and power must be allocated in the work breakdown structure among all contributing components.

"Supplemental" Requirements are imposed on the system by virtue of specific implementation decisions. For example, the utilization of a particular integrated circuit might limit operating temperatures for the entire system, even though the original specification did not have a temperature limitation. Additionally, Supplemental Requirements may be internally imposed. For example, a particular company may have a policy against using parts made by a particular competitor, or may have additional requirements regarding documentation of the system development. It is important that the Supplemental Requirements be uniquely identified so that when alternative implementations are considered, it is possible to identify quickly which requirements might be relaxed or removed, and under what conditions this would occur. All Supplemental Requirements are further identifiable as Structural, Compliancy or Allocatable Requirements.

SYSTEM LEVEL AUTOMATION TOOL FOR ENGINEERS (SLATE)

Figure 3:
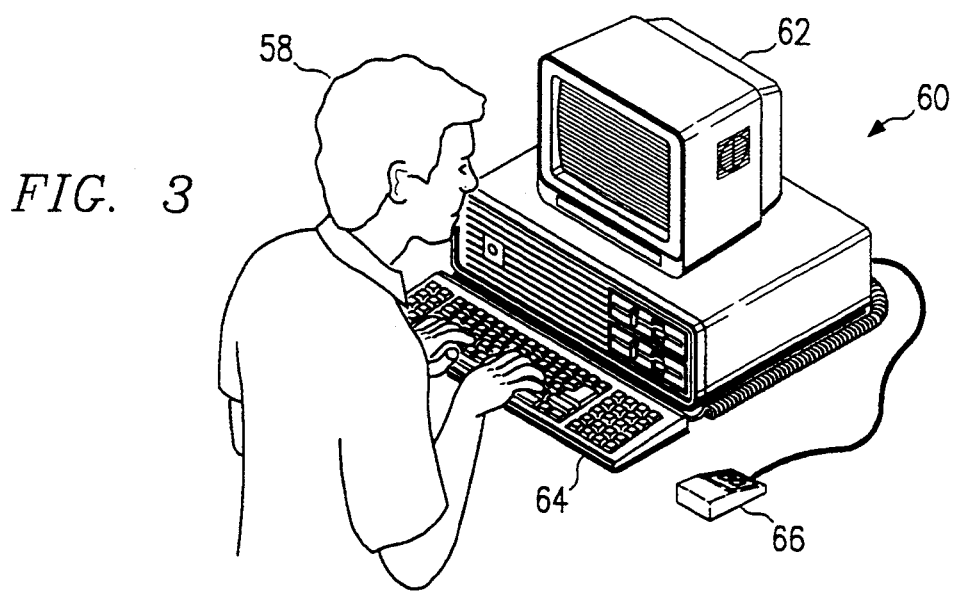
FIG. 3 illustrates a perspective view of a preferred hardware embodiment for the present invention.

FIG. 3 illustrates a perspective view of a preferred hardware embodiment for the System Level Automation Tool for Engineers (SLATE) of the present invention. The user 58 inputs and receives information to a workstation 60 having a monochrome or color monitor 62 and input devices such as a keyboard 64 and a mouse 66. The workstation should be able to operate a graphical windowing system, such as X-windows. The workstation 60 is connected to a network in order to share the information stored in its database with a plurality of users.

Figure 4:
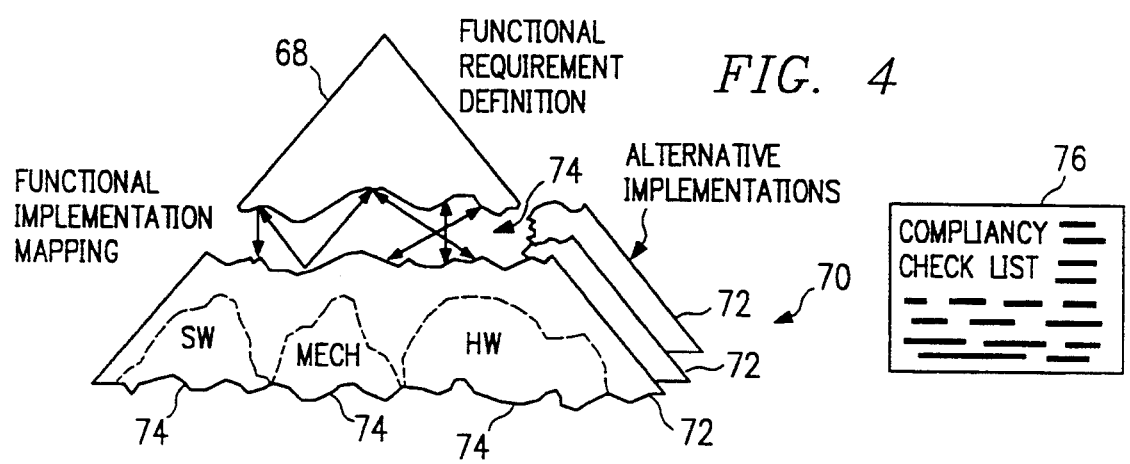
FIG. 4 illustrates an abstract model of the engineering cycle to which the present invention applies.

FIG. 4 illustrates an abstract model of the engineering cycle which SLATE aids in developing. The top level of this model is the Functional Requirement Definition ("FRD") 68. The FRD is a problem statement where the operational and other customer needs are collected. These needs are refined into a set of system requirements. Each requirement can be categorized into one of the four types described hereinabove. Below the FRD level 68 is the Implementation Logically Mapped Alternatives ("ILMA") group 70. Each ILMA 72 is a possible implementation of the FRD 68. ILMAs 72 are bound to the FRD through a Functional to Implementation Mapping ("FIM") 74. There is only one FRD level 68 in a system, there may be many ILMAs 72, one for each possible implementation alternative. Each ILMA 72 may be divided into functional categories 74 shown in FIG. 4 as software, mechanical and hardware categories. The compliancy checklist 76 contains a list of compliancy requirements and is maintained separate from the functional structures in SLATE.

SLABS

Figure 5:
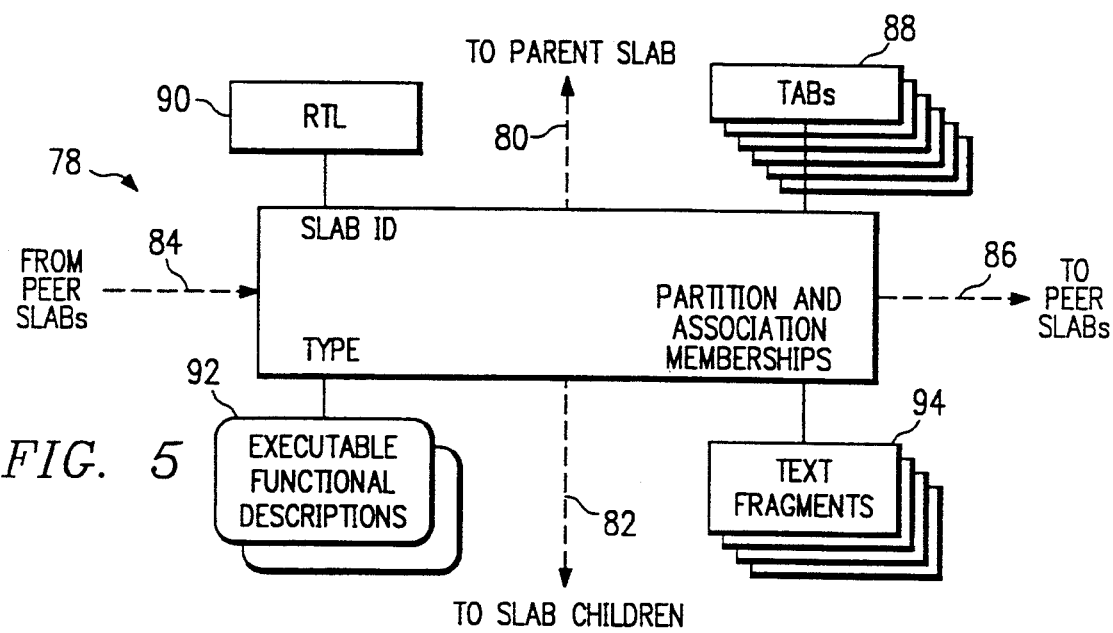
FIG. 5 illustrates a system level abstraction block (SLATE)

The base object in SLATE is the decomposition of the system into "System Level Abstraction Blocks" ("SLABs") 78, illustrated in FIG. 5. The SLABs 78 can be thought of as a basic element of a functional block diagram. Each SLAB 78 has a unique identifier, such as "carburetor", supports "upwards" hierarchical links 80 to "parent" SLABs and "downward" hierarchical links 82 to "children" SLABs. Links between SLABs 78 on different hierarchical levels is illustrated in greater detail in connection with FIG. 6. Further, each SLAB supports functional links 84 and 86, to and from peer SLABs, respectively. Peer SLABs are SLABs on a common hierarchical level. The interrelation between peer SLABs is also shown graphically in connection with FIG. 6. Additionally, each SLAB 78 supports Technical Allocation Budgets ("TABs") 88, Requirements Traceability Links ("RTLs") 90, executable Functional Descriptions ("FDs") 92 and text fragments 94. TABs 88 are used to maintain an account of quantifiable requirements which must be spread out among various SLABs in a hierarchical level. For example, if a system has a requirement that the weight should be no greater than seven pounds, then the weight tab associated with a single hierarchical level should not exceed seven pounds.

SLATE supports two types of RTLs 90—structural RTLs and allocatable RTLs. A structural RTL links a text fragment relating to a structural requirement to a SLAB. For example, a proposed system for a transmitter/receiver may have a requirement that encoding shall be performed using algorithm A and decoding shall be performed using algorithm B. An RTL would tie the text fragment containing the encoding/decoding requirements to a SLAB(s) which accommodates the requirement.

An allocatable RTL ties an allocatable requirement to a TAB definition. Allocatable RTLs are discussed further in connection with FIGS. 7a-b.

Text fragments 94 are one or more paragraphs of textual information associated with the SLABs 78. The text fragments 94 may be used for a variety of purposes, such as documentation, proposals, maintenance information, manuals, and so on. The text fragments 94 may have an associated description field identifying their purpose.

The executable functional descriptions 92 are used to compute outputs from inputs in order to test the functional operation of SLABs. Executable FDs are discussed in greater detail in connection with FIG. 8.

FIG. 6 shows an illustration of the preferred embodiment of the user interface for SLATE. The interface, referred to generally by reference numeral 96 provides menu areas 98 each comprising a plurality of keys 100 which may be selected using the mouse 66 or other input device. The function of each of these keys will be described in greater detail hereinbelow. The interface 96 further provides a viewing area 100 which may be subdivided into a plurality of windows, shown as 102 and 104. A message area 105 is used to display messages from the system to the user.

Window 102 illustrates the hierarchical decomposition of a concept into system components of increasing detail. The top level SLAB 106 has the ID "Vending Machine." The vending machine concept has been broken down into six (6) children SLABs 108–118. Children SLABs for Coin Handling SLAB 114 are shown as SLABs 120–130. Changer SLAB 122 has two children SLABs 132 and 134. Change Supply SLAB 134 has four children SLABs 136–142. Viewing area 104 illustrates the peer to peer connection between the children SLABs 144–150 of the Product Handling SLAB 116.

TABS

An important aspect of the preferred embodiment is the TAB allocation function of SLATE. FIGS. 7a-b illustrate a pop-up menu used to configure TAB for a particular SLAB. FIG. 7a illustrates a TAB 152 for the vending machine SLAB 106 and FIG. 7b illustrates a TAB 154 for the Product Inventory Chamber SLAB 110.

TABs 88 contain parametric information that describe the limits, goals, actual values and unit for quantifiable (allocatable) requirements. There are several pieces of information stored in a TAB, including: maximum parameter limit, minimum parameter limit, goal parameter value, actual (calculated) parameter value, parameter confidence factor, and the unit the parameter is expressed in (volts, amps, and so on). In many cases, only one of the maximum or minimum parameters will be used, for example, when a requirement sets forth a value which may not be exceeded.

SLATE design is built around hierarchical decomposition of system blocks, as shown in FIG. 6. Each system level provides increasingly detailed structures, until component level implementation detail is reached. System requirements normally mandate limits placed on higher levels of system architecture structures (e.g., a system must not weigh more than twelve pounds), while the physical aspects that constitute the actual make-up of the parametric data (e.g., the microprocessor weighs five ounces) normally are introduced at the lowest system design levels. Consequently, SLATE is designed to propagate the limits and goals for each parametric requirement downwardly via the TABs 88 while simultaneously constructing actual/realized values upwardly through the TABs by summarization of the contributions of the children SLABs. Some constraints, like reliability factors, require their own algorithmic calculations and cannot be derived by simple summation.

A major difficulty in complex systems is that a stated allocatable requirement is normally an aggregate limit placed on the overall system behavior and/or composition, and the system engineer lacks the ability to link the impact of design decisions made at lower levels, which are often orders of magnitude removed from the initial allocation. The problem is further complicated upon recognition that the design is constrained in multiple dimensions, i.e., one design parameter may act adversely upon another design parameter. For example, if a circuit needs to respond faster to meet a first requirement, one alternative may be to use higher powered components. However, more power consumption may require more thermal dissipation which might affect another constraint, and an increase in cooling capacity might increase weight. The TABs 88 associated with the various SLABs provide the ability to not only track complexities, but to supply enough additional information within the localized context to aid the designer in understanding the available options. In the previous example, it was stated that cooling capacity might increase weight. However, by having the ability to track weight throughout the SLABs, the system engineer may determine that another portion of the system has been allocated more weight (i.e., has a weight goal) which is unnecessarily high based on a particular implementation. This may allow the system engineer to use higher powered components without exceeding the weight constraint of the overall system.

The parameter value stored in each TAB must be recalculated whenever a variable (with regard to the equation field 188) or the Actual Value associated with a Child SLAB is changed, before contextual analysis can be valid.

The system designer has the ability in SLATE to distribute the local parametric budget to each subcomponent in a logical manner. For example, if a unit has a maximum weight of five pounds, and is composed of three subunits (each subunit represented on a SLAB), the designer might allocate the TAB limits as one pound for the first subunit, one pound for the second subunit and three pounds for the third subunit. Similarly, the designer might distribute the weight as two pounds for the first subunit, three pounds for the second subunit and zero pounds for the third subunit, if the third subunit has no weight, such as a software module. The designer also has the ability to hold some local limit and/or goal in judgment for later allocation if needed. Limits and goals are inserted for each SLAB and "flow down"; as a result, for each SLAB in the system, a comparison can be made algorithmically between goals, limits and realized actuals. Actual conditions exceeding or even approaching limits and/or goals can be flagged for special attention by the system engineer. Under-utilized allocations for certain SLABs may be redistributed to SLABs exceeding the lower goals, as can portions of the budget held in reserve (i.e., available but not allocated).

Each TAB 88 includes a confidence factor which indicates the degree of certainty that can be associated with the numeric quantity (estimated versus measured). Thus, during TAB redistribution, limits on precisely measured TABs may be trimmed closely, while a larger margin of error can be provided for TABs 88 with uncertain estimates, while still staying within the overall system limit. Table I provides the certainty categories from least certain (1) to most certain (10).

TABLE 1

Confidence Factors

1. Uninitialized
2. Global default
3. Partition default
4. Computed from lower hierarchy
5. Model specified
6. User specified
7. Special/other
8. Customer specified
9. Specified by standards
10. Physical Law When calculating, the actual lowest valued confidence factor is propagated up the hierarchical TABs thereby indicating how much flexibility exists within or under a SLAB 78.

FIG. 7a and 7b illustrate pop-up menus 152 and 154 to define a TAB 88 for a SLAB 78. Menus 152 and 154 each include a TAB Name Field 156, a SLAB Name Field 158, a TAB Units Field 160, a Goal Value Field 162, a Minimum Field 164, a Maximum Field 166, a TAB RTL Field 168 (which points to an allocatable requirement) and an Actual Value Section 170. The Actual Value Section 170 allows the designer to select one of three methods for determining the actual value of the TAB for the associated SLAB. The designer may choose to determine the actual value through a mathematical operation on corresponding TAB values associated with the children SLABs by using fields 172, 174, 176 and 178. A second method for providing an actual value is to use an assigned value using fields 180 and 182. A third method is to determine the actual value by an equation using fields 184, 186 and 188. The chosen method is indicated by pointer 189.

Equation field 188 may be used to provide an equation by which the actual value may be determined. The actual value determined by the equation is output in field 184. Field 186 is a confidence value associated with the computed value.

The assigned value of field 180 may be input by the designer. The Confidence Field 182 provides a confidence level associated with the Assigned Value.

The actual value may be computed based on a computation of the TABs associated with the children SLABs. The designer enters the desired operation in field 174. Typically, the desired mathematical operation will be a summation; however, other operations may also be provided. For example, to determine a reliability factor, a multiplication operation on the actual value associated with the children SLABs may be necessary. The confidence factor in field 176 is computed from the confidence factors associated with the children SLABs.

FIG. 7a illustrates a menu which the designer has completed for the "weight" TAB. This TAB is associated with the vending machine SLAB 106, which is the top SLAB in the hierarchy. Therefore, the goal of 6,000 pounds for the Weight TAB is an overall system goal. A minimum weight of 5,000 pounds is specified and the maximum weight of 7,000 pounds is specified. An Actual Value of 5,550 pounds is computed using the sum of the children SLABs. Thus, SLABs 108–118 each have associated Weight TABs which total to 5,550 pounds.

FIG. 7b illustrates a "capacity" TAB associated with the Product Inventory Chamber SLAB 110. The goal is to provide a capacity of 550 cans, with a minimum of 400 and a maximum of 700. In this instance, the Actual Value of 545 cans is computed through an equation entered in field 188.

EXECUTABLE FUNCTIONAL DESCRIPTIONS (FDs)

FIG. 8 illustrates a block diagram showing the operation of an executable FD. As discussed in connection with FIG. 5, a SLAB 78 may have one or more executable FDs 92 which transform inputs into outputs. The executable FD 190 has two inputs "i" and "X" and two outputs "o" and "Y". Y represents a group of output signals and X represents a group of input signals; $Y=f(X)$ is the generalized functional description. The input, i, is a secondary input used to initialize the block, provide interim parametric storage, implement breakpoint capability, and so on. The secondary output, o, provides a reportable data path. The designer using SLATE is responsible for defining the executable FDs, the interconnections between host SLABs/FDs and the functional/process consistency between FDs and among their interconnections. The function f(X) may use local variables and parameters.

TEXT FRAGMENTS

Figure 9D:
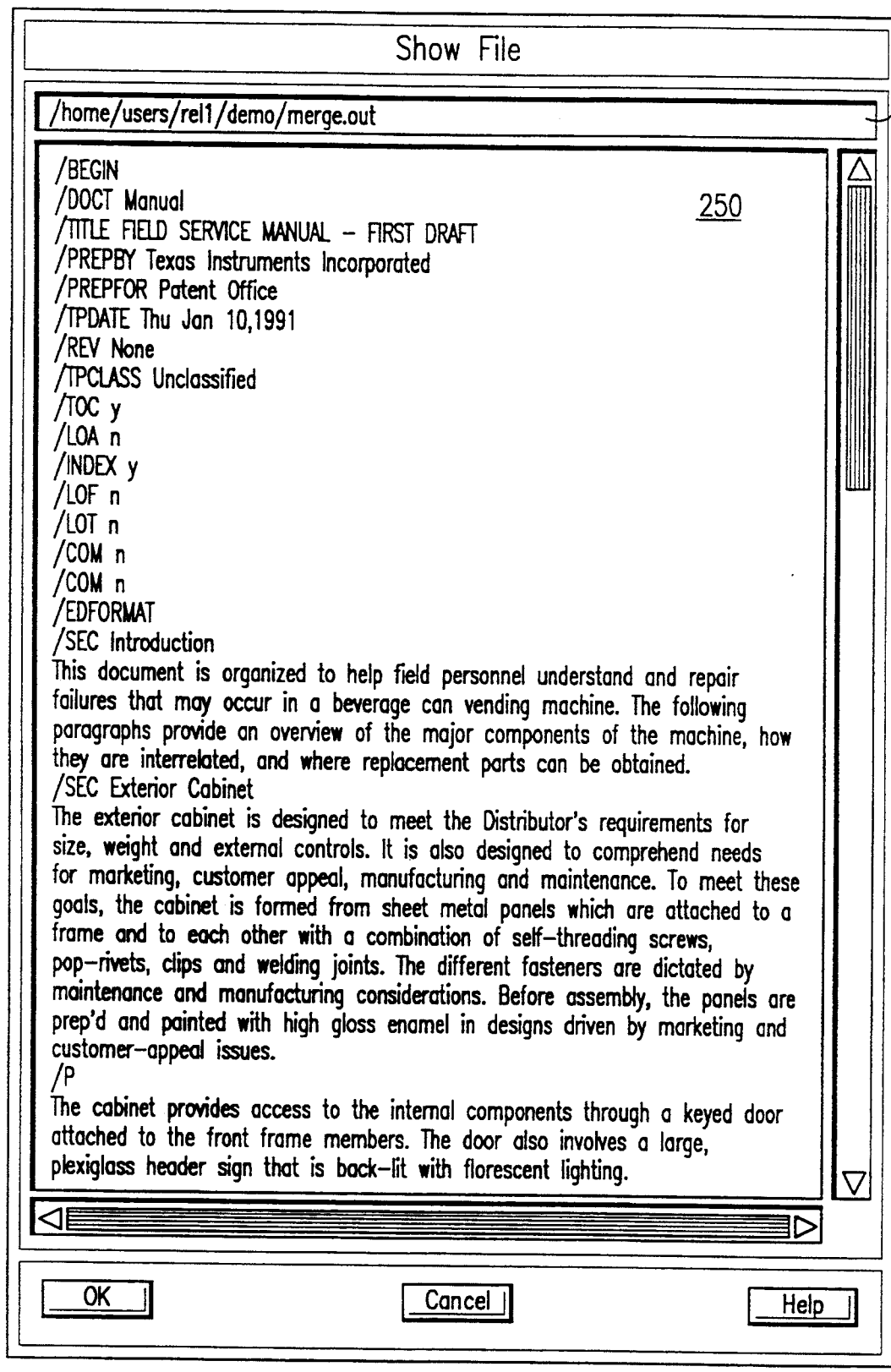

FIGS. 9a–d illustrate the text fragments 94 and the automatic document generation functions provided by SLATE. As previously discussed, any number of text fragments 94 may be associated with each SLAB 78. FIG. 9a illustrates a text fragment associated with the Product Inventory Chamber SLAB 110. A Modify Text Fragment menu 192 is shown in FIG. 9a. The menu 192 provides a Name Field 194 for the name of the text fragment, a Numeric ID Field 196 for providing a numeric ID for the text fragment (an alternate name), a Description Field 198 for describing the text fragment, a Key Word Field 200 for listing key words associated with the text fragment, an Attachment Field 202 specifying the SLAB to which the text fragment is associated, a Referring Documents Field 204 listing documents which incorporate the text fragment and a Edit Field 206 displaying the content of the text fragment to be modified.

FIG. 9b is a Format Block menu for specifying parameters for a document comprising one or more text fragments 94. The menu 208 includes a Name Field 210 for entering the name of the document to be generated, a Title Field 212 for providing a title for the document, a Document Type Field 214 for specifying a document type (such as manual, statement of work, proposal, etc.), a Publisher Name Field 218, a Contract Name Field 220 for specifying a particular contract with which the document is associated, a Customer Field 222 for specifying the entity for which the document is being generated, a Revision Field 224 for specifying a revision identifier, a Date Field 226 for specifying the date of the revision, a Classification Field 228 for specifying a confidentiality classification for the document, Header and Footer Fields 230, and Document Support Fields 232 for specifying whether the document contains a table of contents, index, acronym section, reference document section, list of appendices, list of figures, or lists of tables.

FIG. 9c illustrates an Editor Menu 234 for constructing a template for the document. A Name Field 236 provides the name of the document. Document Title Field 238, Revision Field 240, Date Field 242, and Classification Field 244 have the same functions as described in connection with FIG. 9b. The Structure Field 246 allows the user to provide a template describing the organization of the document and the referenced text fragments. For example, under section three ("Product Inventory Chamber"), the text fragment "Chamber" is referenced. This text fragment is shown in FIG. 9a.

In FIG. 9d, the merged output based on the document template is illustrated. The file name is provided in Name Field 248 and the text is provided in Text Field 250. As can be seen, various files have been merged into the template shown in FIG. 9c. The merged document provides a number of control commands such as "/BEGIN", "/DOCT", and "/TITLE". In the preferred embodiment, however, the merged document may be formatted to be compatible with the file specifications of any one of a number of popular word processors.

TRAMs

As previously discussed in connection with FIG. 4, a design may be structured as a functional requirement definition (FRD) 68, separated from one or more implementation logically mapped alternatives (ILMAs) 70 by a functional-to-implementation mapping (FIM) 74. In practice, a number of FIMs may exist, not only between the FRD and the ILMA, but also between different levels of ILMAs. Anywhere there is a logical "leap of intuition" in synthesizing a solution, or anywhere an abstract concept (function, algorithm or need) is mapped onto a system resource (for example, by assignment of ports, interrupt handlers, scheduling of band width, etc.), a FIM exists, and the object for recording the mapping in SLATE is a TRAM (TRAnsitional Mapping).

FIG. 10 illustrates a TRAM 252. A TRAM 252 is a conduit to convey functionality, requirements traceability, and technical allocation budgets across FIMs 74 in the design structure. The TRAM 252 provides a special parent-child relationship, described herein as a "foster parent-foster child" relationship between SLABs. The TRAM 252 links one or more "foster" parent SLABs to one or more "foster" children SLABs. Each SLAB may be linked to one or more RTLs 90 and TABs 88 from the foster parent SLABs and may have associated text fragments 94 which describe the TRAM interlinks.

FIGS. 11a and 11b illustrate common uses of TRAMs 252. In FIG. 11a, a control hardware SLAB 254 and a process software SLAB 256 are coupled via TRAM 258 to a microprocessor with ROM SLAB 260. This 2:1 mapping of SLABs 254 and 256 to SLAB 260 could not be achieved using hierarchical decomposition, since SLATE allows any SLAB to have, at most, one parent. In the example of FIG. 11a, SLABs 254 and 256 are the foster parent SLABs and SLAB 260 is the foster child SLAB.

FIG. 11b illustrates a second example of a TRAM wherein a communications channel SLAB 262 is coupled to a queuing software SLAB 264, a queuing hardware SLAB 266, a protocol SLAB 268 and a bus hardware SLAB 270. The communications channel SLAB 262 includes an RTL 272 and a radiation TAB 274. The RTL 272 is transferred via the TRAM 276 to the foster children TABs 264–270. The radiation TAB 274 is allocated between the queuing hardware SLAB 266 and the bus hardware SLAB 270. The radiation TAB 274 may be allocated in any desired ratio; for example, one-third of the allowable radiation associated with the communications channel could be allocated to radiation TAB 274 associated with the queuing hardware SLAB 266 and two-thirds of the radiation could be allocated to radiation TAB 274 associated with the bus hardware SLAB 270.

In recording complex system designs, providing clear documentation of the thought processes behind the derivation of the details of an implementation from original requirements presents a major problem for the system engineer. Major portions of the system's design description can normally be represented by a top-down hierarchical decomposition. SLATE uses such a hierarchical detail decomposition paradigm, with standard SLAB parent-child relationship, to carry the bulk of most system design descriptions. The difficulty occurs when standard hierarchical structure is not adequate to explain the complexities involved in relationships that have resulted in the final design embodiment. Typically, it is these precise complexities that are most in need of explanation and supporting documentation, but for which designers have historically had no special documentation tools to work with. In the SLATE paradigm, the TRAM mechanism handles these complex relationships.

At least three categories of complexities necessitate the TRAM structure as a supplement to the standard hierarchical SLAB structure. The three categories are:

1. Mapping conceptual requirements onto implementable components and subsystems. (This is the original SLATE "classic" TRAM, sometimes referred to as "bridging the FIM".) This involves a shift of perspective from a statement of need to a planned solution. Examples of the mapping of these conceptual requirements are shown in FIGS. 11a–b.
2. Mapping the merger of a secondary requirement onto an existing implementable component(s) and-/or subsystem(s) that was previously designed to satisfy a different functional need. An example of this mapping is provided hereinbelow.
3. Remapping "current" perspective of a potentially implementable structure onto a different set of implementables that are "closer to" the final design implementation. This category is subtle to grasp, because it is natural in the SLATE paradigm to think about one hierarchical structure of implementables. In practice, a solution is formed by "nibbling" away at the total picture until it can be broken down into digestible bits and pieces. Thus, in the interim process of "getting to a design solution", the system designer travels through many intermediate steps that help redefine the need in terms closer to what will finally be implemented. A common occurrence of this category involves gathering up multiple uses of shared resources and coalescing the need into a common design embodiment. Since the individual usage points are never implemented, it is not correct to think of the SLABs in which they are identified as "implementables" (even though they could have been implemented individually in placed and even if every other SLAB in the hierarchical structure is the final design embodiment) because, as used in context, these SLABs form a needs requirement that will be met in the final design by implementing a shared resource.

Much of what has previously been written about SLATE has postulated the existence of an extensive detailed requirements list. The example given below has been chosen to illustrate how the same process evolves even from loosely stated "mission statements" that are representative of commercial undertakings. The example selected involves designing an automobile.

A partial list of the rationale and requirements driving a commercial manufacturer in its design of automotive vehicles might be stated as:

"We intend to offer a viable product for sale on the commercial market by:

* Meeting governmental requirements that allow the product to be sold.
 * Meeting functional requirements and needs of our customer base.
 * Appealing to the potential customers' 'care abouts'."

Such a requirements list can be mapped into a "Functional Requirements Definition" structure shown in TABLE 2, and broken down hierarchically into finer detail. Each hierarchical line entry in the following could correspond to a SLAB in SLATE.

TABLE 2

| | Functional Requirements Definition |
|---|---|
| 1.1 | Offer a viable product for sale on the commercial market. |
| 1. | Meet governmental requirements to allow product to be sold. |
| 1.1.1 | Meet Safety Standard. |
| 1.1.2 | Meet Environmental Pollution Standards. |
| ... | |
| 1.2 | Meet functional needs of customer base. |
| 1.2.1 | Cargo Capacity. |
| 1.2.2 | Operational Speed. |
| 1.2.2.1 | Horsepower of Engine. |
| 1.2.2.2 | Weight of Vehicle. |
| 1.2.3 | Operational Range on single tank of gas. |
| ... | |
| 1.3 | Appeal to customers' "care abouts". |
| 1.3.1 | Supply Comfort. |
| 1.3.2 | Supply "Ease of Handling". |
| 1.3.3 | "Eye Catching" Design. |
| 1.3.4 | Minimize "Cost of Operation". |
| 1.3.4.1 | Maximize "Miles per Gallon". |
| ... | |

Further breakdown might be done in any given area (for example, under 1.2.2 Operational Speed, further detailing down to mathematical relationships between weight, horsepower, aerodynamic quality of design, etc., might be comprehended). However, a tops-down refinement will not reach a design for an automobile, because the functional requirements definition hierarchy does not deal with "implementables". No carburetors, no tires, no pistons, no windshield wipers or tail lights are provided for. Clearly a TRAM mapping must exist between the elements out of which the automobile is built and the functional requirements definition provided in Table 2.

The implementation can also be described in a similar hierarchical structure provided in TABLE 3. One such structure, in part, might be detailed as follows:

TABLE 3

| | Implementation Hierarchical Structure |
|---|---|
| 1. | Automobile. |
| 1.1 | Structural Body/Chassis. |
| 1.2 | Interior Passenger Chamber. |
| 1.3 | Engine. |
| 1.3.1 | Engine Block. |
| 1.3.2 | Carburetor. |
| 1.3.3 | Radiator/Cooling System. |
| 1.3.3.1 | Fan. |
| 1.3.3.2 | Water Pump. |
| 1.3.3.3 | Heater. |
| 1.3.3.4 | Defroster. |
| 1.3.3.5 | Radiator |
| 1.4 | Power Train. |
| 1.5 | Exhaust System. |
| 1.5.1 | Tail Pipe. |
| 1.5.2 | Muffler. |
| 1.5.3 | Catalytic Converter. |
| 1.6 | Electrical System. |
| 1.6.1 | Battery. |
| 1.6.2 | Alternator. |
| 1.6.3 | Lights. |
| 1.7 | Optional Features. |
| 1.7.1 | Power Steering. |
| 1.7.2 | Cruise Control. |
| 1.7.3 | Air Conditioner. |

As in the prior hierarchy, the choices are subjectively grouped, and no single embodiment of "associations" should be considered "correct". Rather it should be regarded as a documented record of the perspective in which the designer viewed the system.

Within SLATE, the TRAM mechanism is used to construct the mapping between the functional requirements definition and the implementation hierarchy. For the automotive design example, the SLATE design scenario might be:

CONSTRUCTION OF TRAMs

The user already has the two SLAB hierarchies illustrated above in Tables 2 and 3 to work with. The user then selects the "Action/Object" command "Add/-TRAM". A Pop-up Window opens that allows the user to specify the particulars of this TRAM. The TRAM will be given a name that the user can reference it by. The input side connections (foster parent SLAB(s)) from the Functional Requirements Definition hierarchy in this example) are specified. The output side connections ("adopted child(ren)) SLAB(s)" in the Implementation hierarchy in this example are specified. At this point, the new TRAM is established and "lives" in the Database in much the same manner as a normal SLAB does.

Having established the TRAM, the user is then free to "enhance" it in a manner very similar to what he/she would do if it were a standard SLAB. The user can "Add/Text Fragment" to explain the thought process behind the mapping carried via the TRAM. The user can "reroute" TABs that are attached to the TRAM's foster parents, to flow wholly or partially through the TRAM (by controlling TAB propagation at the foster parent SLAB) and then appropriately routing the portion of the TAB propagated into the TRAM, at the TRAM itself. "Requirement Traceability Links" can be either attached (mouse clicks tieing requirement to TRAM) or propagated through the TRAM (standard RTL propagation window usage on both the foster parent SLAB(s) and TRAM).

Using the automotive example, the user might call out the following:

```
ADD-TRAM ... TRAM Name=PASSENGER
   RESTRAINT SYSTEM

Foster Parent SLABs=SAFETY STANDARD
   XXX (1.1.1.8.4) PASSENGER COMFORT
   (1.3.1.6)

Adopted Child SLAB=AIR BAG (1.2.8.3.9)
```

A text fragment might be placed on this TRAM explaining that the Air Bag is judged more comfortable than harnesses per a consumer survey. A different model car might have economy requirements outweighing comfort, and opt for shoulder harnesses. Still others might bring economy, safety and comfort together at this TRAM, and offer the customer a standard shoulder harness or optional air bag system. Whatever the structure or outcome, the TRAM documents the reasoning that lead to the design implementation, and provides traceability both to and from the factors that were considered in the design process.

The Passenger Restraint TRAM has a single adopted child, and multiple foster parents. It is referred to as an "N-to-1" TRAM because it maps a plurality of foster parents (Safety Standards and Passenger Comfort), transition mapping onto a single adopted child (Air Bag). The "N-to-1" TRAMs are the most obvious TRAMs in the design, because a SLAB, by definition, can have, at most, one parent. Therefore, if multiple concerns are focusing together to result in a single implemented entity, the SLAB is not just a detailed refinement of previously explained concepts, but instead constitutes a synthesis of multiple ideas that have been developed (a new perspective), and must be mapped via TRAM(s) to clearly delineate the intended relationships. The TRAM example above fits nicely into the category 1 TRAM rationalization.

Somewhat more subtle is the "1-to-N" TRAM, where a single foster parent's attributes are tied to numerous adopted children as shown in FIG. 11a. This is sometimes confused with the normal hierarchical parent-child relationship (as shown in FIG. 6), and at times spawns questions about the need for a "1-to-N" TRAM. The answer lies in "the Change of Perspective" and can best be explained by example. Consider the following:

```
TRAM Name = CHOICE OF NON-TOXIC MATERIALS
Foster Parent SLAB =   SAFETY REGULATION RE-
                       QUIRING NON-INFLAMMABLE
                       MATERIAL USAGE (1.1.1.3.5)
Adopted Children SLABs = SEAT UPHOLSTERY MA-
                       TERIAL (1.2.8.3.5.9)
                       RADIATOR HOSES (1.3.3.6)
                       EXTERIOR VINYL TRIM
                       (1.7.6.2)
                       ... ETC....
```

Clearly, the radiator hoses are not included "just to have non-toxic material usage". Their primary function is to carry fluids in the cooling system (hence their direct ancestry passes through SLAB 1.3.3-Radiator/-Cooling System). In this example, numeric technical budgets are not appropriate, as no numeric quantification is present, nor distributed. Attempting to relegate the Non-Inflammable Material Usage to a compliancy checklist would dilute the detail of this design structure, afforded by using a "1-to-N" TRAM. This is a category 2 utilization of TRAMs.

When both the driving needs and the resultant implemented structures are distributed, the TRAM becomes an "N-to-M" mapping. For example, the electronic systems in automobiles have grown in their sophistication, the need to communicate status information and commands throughout the automobile has become complex enough that some automobiles now have an internal "data bus" routed throughout the car. An associated "N-to-M" TRAM in the design of such an information bus might be described as:

```
TRAM Name = AUTOMOTIVE INFORMATION BUS
Foster Parent SLABs =  Sensory data on air/fuel mix
                       Sensory data on engine timing
                       Sensory data on emissions
                       Sensory data from "Gas Pedal
                          Position"
                       Sensory data from "Brake Pedal
                          Position"
                       Sensory data from Speedometer
                       Sensory data about oncoming
                          lights
                       Sensory status of headlight
                          beams
                       Control Microprocessor
                          Algorithms
Adopted Children SLABs = Electrical Data Bus Cabling
```

-continued

Microprocessor (with software in ROM)
Bus multiplexer hardware
various sensors . . .
various actuators . . .
. . . etc. . . .

There are many points to be made about this TRAM. The first is that it clearly constitutes "an assemblage of components to perform several functional tasks", a statement that is probably true of all "N-to-M" TRAMs. Since it is an "assemblage of components", it is conceivable that it could be thought of as a subsystem, contracted out, and become in essence, an "off-the-shelf" component. Such changes of perspective should not be surprising, since even the automobile itself could be viewed as a component in some higher level systems. Therefore, the TRAM documents the perspective being dealt within a relative context, and the information contained therein must be considered within that context to be properly understood. No value judgment is assigned to the perspective.

There is a commonly occurring theme in many system designs involving multiple usage of a reusable/shareable resource (such as a hardware bus, or a software subroutine). Implementing each occurrence separately (as would be demanded in the strictest sense under a topsdown hierarchical design structure) normally runs counter to the almost universal requirement of maximizing efficiency by minimizing cost. The gathering up of these multiple occurrences, and implementing a smaller number of resource suppliers (often just one), constitutes a change in perspective, and necessitates a TRAM. Significantly, it will appear that such a TRAM maps from one view of the implementation to another view of the implementation. In actuality, the first hierarchical structure is a mixture of implementables and "functional needs". The remapping of the "structural points needing usage of the functional resource" to a perspective that will be implemented as a shared resource via a TRAM confirms that the intermediate hierarchical structure is not "purely implementables", or at least not with relation to the final system design being implemented.

MORTAR

Once the FIM region has been traversed via TRAMS that computationally link allocatable requirements, structural requirements and implementation structures as well as documenting the underlying considerations, attention can then be paid to documenting the macro level synergistic effects that may occur at a FIM. The SLATE mechanism for explaining the macro synergistic considerations is MORTAR (Mapping Of Regional TRAMs and Requirements).

MORTAR provides the structure to bind together the synergistic relationships inherent in a set of TRAMs. The MORTAR is actually composed of supportive textual description and quantitative matrix descriptors that explain synergistic effects occurring between and among the TRAMs. These types of relationships are especially important to document when the FIM mapping is actually undergoing multiple constraints, and the resultant implementation choices are multiply bound in subtle, secondary manners, a condition that is at the heart and core of "concurrent engineering".

An illustrative example at this point will clarify many points and offer a reference situation against which some of the concepts can be more fully elaborated. Consider the following example:

Needed Functionality:
Design a system that sorts, classifies and correlates "items".

Constraints:
System cannot weight more than 70 oz. nor use more than 5 amps, and must process at least 6000 "items"/second.

Requirements List (derived from above):
R1—Sort
R2—Classify
R3—Correlate
R4—<70 oz.
R5—<5 amps
R6—6000 items/sec.

Potential "System Components" in implementing a solution:

TABLE 4

| TYPE | Electronic Chips | | | |
| --- | --- | --- | --- | --- |
| | MIPS | WEIGHT | POWER | COST |
| Microprocessor XYZ | 6.5 | 4.5 oz | 400 ma | $38.75 |
| Microprocessor RST | 8.2 | 6.2 oz | 750 ma | $46.20 |
| Microprocessor JKL | 3.5 | 3.4 oz | 350 ma | $14.50 |
| 256 K DRAM | — | 2.5 oz | 160 ma | $1.38 |
| 1 Meg DRAM | — | 4.9 oz | 425 ma | $12.42 |

TABLE 5

| | Software Algorithmic Components | | | |
| --- | --- | --- | --- | --- |
| ID | FUNC-TION | COMPATI-BLE WITH | EXCLUSIVE MEMORY NEEDS | INST EXECUTED PER ITEM |
| J14 | Sort | RST | 4 Meg | 84 |
| J93 | Sort | JKL | 2 Meg | 134 |
| J42 | Sort | XYZ | 1 Meg | 272 |
| C15 | Classify | JKL, XYZ | 40 K | 93 |
| C15 | Classify | RST | 58 K | 75 |
| C88 | Classify | XYZ | 825 K | 26 |
| S71 | Correlate | JKL, RST | 4 Meg | 852 |
| S64 | Correlate | XYZ | 14 Meg | 148 |

SLATE may accommodate numerous interpretations and approaches to each design, and there is not a single "right" approach. The definition of how TRAMs are defined and mapped reflect the individual design approach of the user, and must be complete and consistent within the framework that the design is viewed by the user. In essence, the TRAMs capture the perspective view that the designer intended. Alternate views may be equally valid. The example continues with one possible perspective that works.

Analysis:
Correlation function S64 consumes so much memory, that the power and weight limits are exceeded if it is used. Since S64 is the only correlation function compatible with XYZ, then XYZ is not a viable alternative.

The throughput requirement requires that if microprocessor JKL is utilized, at least two of them will have to work in parallel.

| | Weight | Power | Cost |
| --- | --- | --- | --- |
| Solution 1: (Least Expensive) | | | |
| Microprocessor-JKL, Qty 2 | 6.8 oz | 0.7 a | $29.00 |
| DRAMs-256 K, Qty 25 | 62.5 oz | 4.0 a | $34.50 |

-continued

|  | Weight | Power | Cost |
|---|---|---|---|
| Software-J93, C15, & S71 | | | |
| Resulting Solution Processes 6481+ items per second. | | | |
| *Solution 2: (More Expensive, but less power & weight)* | | | |
| Microprocessor-JKL, Qty 2 | 6.8 oz | 0.7 a | $29.00 |
| DRAMs-1 Meg., Qty 7 | 34.3 oz | 2.975 a | $86.94 |
| Software-J93, C15, & S71 | | | |
| Resulting Solution Processes 6481+ items per second. | | | |
| *Solution 3: (Faster, better throughput at a higher cost)* | | | |
| Microprocessor-RST | 6.2 oz | 0.75 a | $46.20 |
| DRAMs-1 Meg, Qty 9 | 44.1 oz | 3.825 a | $111.78 |
| Software-J14, C15, & S71 | | | |
| Resulting Solution Processes 6923+ items per second. | | | |

There are a number of other potential solutions if we use a mixture of 256k and 1 Meg DRAMs, that on a sliding scale would cut cost, but would also affect weight and power consumption. For example:

| Solution 3A: (Same throughput, less weight, power & expense) | | | |
|---|---|---|---|
|  | Weight | Power | Cost |
| Microprocessor-RST | 6.2 oz | 0.75 a | $46.20 |
| DRAMs-1 Meg, Qty 8 | 39.2 oz | 3.4 a | $99.36 |
| DRAMs-256 k, Qty 1 | 2.5 oz | 0.16 a | $1.38 |
| Software-J14, C15 & S71 | | | |
| Resulting Solution Processes 6923+ items per second. | | | |

At this level of analysis Solution 3A appears superior to Solution 3, but in reality, the complications of mixing different sized memories and the resulting weight, power and expense of support circuitry might rule out 3A. Assuming that mixing memory sizes is acceptable, having seen across the board improvement in weight, power and cost, the natural inclination is to substitute the 256k DRAMs for all the 1 Meg DRAMs. What worked nicely for a 1-to-1 chip substitution (because both the 1 Meg and 256k DRAMs contain more than enough to cover the C15/58k need) breaks down when a 4-to-1 chip substitution is needed. The applicable deltas for each 1 Meg of substitution becomes:

Weight—Increases by 5.1 oz,
Power—Increases by 0.215 amps, and
Cost—Decreases by $6.90.

While the decreasing cost is desirable, the weight and/or power limits will soon prevent further substitution of 256k DRAMs into an RST based solution.

Supplemental Requirements:
RS1—Need for a microprocessor to run all software
RS2—Memory requirements for SORT SW
RS3—Memory requirements for CLASSIFICATION SW
RS4—Memory requirements for CORRELATION SW To carry through this example, one possible variation of the resultant TRAMs associated with ILMA 2 (Solution 2) are provided below:

```
T1 { (R1) —> (J93) }      Sort SW from requirement to sort
T2 { (R2) —> (C15) }      Classification SW from req. to classify
T3 { (R3) —> (S71) }      Correlation SW from requirement
                           to corr.
T4 { (RS1) —> (JKL) }     Microprocessor from req. to run
                           software
T5 { (RS2, RS3, RS4) —> (DRAMs) } Total memory needs
```

There are still several questions unresolved with this TRAM mapping. First, the system engineer must instruct SLATE to deal with the dual architecture of the parallel JKL processors. Probably the simplest acceptable method would be to have a single SLAB (perhaps named "JKL") that represented the "complete" microprocessor functionality. This SLAB ("JKL") would then have children that would be the two instances of microprocessor occurrence (SLABs "JKL1" and "JKL2"), along with any other circuitry needed to distribute and balance the processing tasks between the twin processors. T4 would be pointing at the functional microprocessor SLAB ("JKL").

The other logical question is how to tie in the allocatable requirements (R4, R5 and R6). It is not unreasonable to introduce a sixth TRAM to map the hardware requirements onto the hardware, e.g.:

T6{(R4,R5)→(JKL, DRAMs)}HW constrainst from req. limits

R6, the requirement that the system process 6000 items/sec., however, remains to be accounted for. An artificial "System" SLAB could be introduced at the highest level, just to map it out of the TAB Definition Table. However, it would be difficult to allocate this "Throughput" TAB to lower SLABs. This "distributed allocatable" (R6) is indicative that the "whole picture" is not yet present, because as was seen in the analysis portion, many subtle linkages are in effect between the TRAMs that must be balanced to reach this solution. The documentation of these TRAM linkages is provided for in MORTAR, and it is the MORTAR that should properly be the recipient of R6 in this case. It should be noted that each MORTAR must belong to an ILMA to reflect the unique sets of TRAMs within its implementation structure.

The core of the MORTAR is its matrix of TRAM relationships. The matrix is composed of all TRAMs within the set being described by the MORTAR, mapped against themselves. Thus, for a set of "n" TRAMS, the MORTAR matrix is "n"×"n", containing "n" squared elements. Any relational mappings are placed in appropriate elements of the matrix. Because such a matrix is mirrored along its diagonal (containing redundant information), only the diagonal and one of the remaining triangular areas need be specified. By convention, the lower triangular area is filled in for MORTAR matrices. MORTAR appears to the designer in a spreadsheet form shown in FIG. 12.

The MORTAR matrix concisely shows all the interdependencies that are applicable for a set of TRAMs selected by the designer. For the Sort SW (T1), it shows that the choice of J93 is tied to JKL microprocessor, it requires 2 Megs of memory, and it will consume 0.81 MIPS of processing. The JKL microprocessor (T4) is shown to have 3.5 MIPS and that a dual pair is used resulting in 67.8 oz of weight and 700 ma of power consumption. Likewise, it is shown that 7 1-Meg DRAMs (T5) are needed, and their contribution in weight and power consumption are listed. R6 can now be directly tied to this MORTAR. Text fragments supporting this MORTAR would expound upon the interdependencies and record details of alternatives considered, and why they were not chosen.

The MORTAR matrix is utilized whenever a change is to be considered. By scanning the row and column for any pertinent TRAM, all dependencies can be checked against for synergistic impact. For example, if someone were to propose using a new faster correlation software routine, the T3 column reveals that the appropriate questions to be considered are:
1. How many MIPS are needed to execute it to our basic R6 requirement?
2. Will it run on the JKL processor?
3. How much memory will it take?

No additional questions are generated by scanning the T3 row because the prior TRAMs (T1 & T2) are not directly dependent on T3 (null entries).

By answering all of these questions, a correct analysis can be made of the overall impact introducing the new software will have. If the new software needed less MIPS, ran on JKL, and did not use much more memory then it would be a very interesting candidate for replacing S71.

In addition to illustrating all the dependencies between TRAMs, a MORTAR matrix is further capable of performing row, column and matrix operations on the various cells. For example, a cell providing a calculation for the needed MIPS according to TRAMs T1, T2 and T3 could be performed by calculating the sum of cells T1-T1, T2-T2 and T3-T3. A total weight cell could be provided by adding the weight specified in cells T6-T4 and T6-T5. These cells could be added to the matrix using conventional spreadsheet techniques.

Even more interesting, from the standpoint of understanding how MORTAR facilitates the analysis of design change impact, is the potential effect of new software that needs substantially less MIPS, less memory, but cannot run on JKL. This scenario would then force the designer to consider changing the microprocessor (T4), which sends him/her back to the MORTAR matrix to determine what needs to be considered when T4 is changed. That would generate the next set of questions, which are:
1. Does J93 run on the alternate processor?
2. Does C15 run on the alternate processor?
3. What MIP rate does the alternate processor run at?
4. What weight and power consumption will the alternate processor use?

The microprocessor change, by itself, does not affect the memory considerations. However, if these questions "domino" into considering further software changes (because either or both J93 and/or C15 do not run on the alternate processor), then memory considerations will reenter the analysis process when the next level of questions are generated from appropriate row/column entries under T1 and/or T2.

Finally, consider the potential impact if a new 4 Meg DRAM were to become available that effectively removed the original barriers (exceeding R4 and R5) that precluded using S64:

| Type | MIPS | Weight | Power | Cost |
|---|---|---|---|---|
| 4 meg DRAM | — | 6.3 oz | 485 ma | $28.00 |
| Solution 4: | | | | |
| Microprocessor-XYZ | | 4.5 oz | 0.4 a | $38.75 |
| DRAMs-4 Meg, Qty 4 | | 25.2 oz | 1.94 a | $112.00 |
| Software-J42, C88, & S64 | | | | |
| Resulting Solution Processes 15695+ items per second. | | | | |

| RESULTING POSSIBLE SOLUTIONS: | | | | |
|---|---|---|---|---|
| Solution Number | Cost | Weight | Power | Items/Sec. |
| 1 | $63.50 | 69.3 oz | 4.7 a | 6481 |
| 2 | $115.94 | 41.1 oz | 3.675 a | 6481 |
| 3 | $156.98 | 50.3 oz | 4.575 a | 6923 |
| 3A | $146.94 | 47.9 oz | 4.31 a | 6923 |
| 4 | $150.75 | 29.7 oz | 2.34 a | 15695 |

If all the above examples were documented in MORTAR, entries in the matrices would establish the relationship between the microprocessor, memory, and software routines that would not allow arbitrary changes to any of the components without appropriate analysis of the impact on the others. The entries in the matrices would indicate which parametric values were being balanced (e.g., board area occupied by chips would not be a constraint in this example) and only the relevant parameters would need to be analyzed.

In addition to the relationship matrix shown above, a shadow matrix could be implemented to carry the actual realized numeric values, allowing computation of the impact of substitutions across an entire system database, and load up analysis programs with libraries of alternative components for overnight batch analysis runs searching for more optimal alternatives. This concept is only possible if the MORTAR relationship are captured and structured, suitable for computational analysis.

The present invention provides numerous advantages over the prior art. Since SLATE handles a wide range of hierarchical levels, a consistent set of tools may be provided for the entirety of a project. Compliancy, structural and allocatable requirements may be carried through multiple levels to allow the system designer to identify problem areas and to identify overt-allocated areas which may be used to solve allocation problems. SLATE allows requirements to flow down and implementation details to flow up, thereby providing the system designer with a broad understanding of the entire system. As implementations change, the accounting of the actual values for the technical allocatable budget may be automatically recalculated.

Further, the TRAM mechanism provided in SLATE encourages documentation of implementation complexities. The relations between TRAMs are documented in MORTAR matrices, providing a means for discerning the intricacies of a proposed implementation change.

Although the present invention and its advantages have been described in detail, it should be understood that various changes, substitutions and alterations can be made herein without departing from the spirit and scope of the invention as defined by the appended claims.

What is claimed is:

1. A method of aiding system design with a computer, wherein the computer performs the following steps comprising:
   decomposing the system design into a first set of objects and a second set of objects, each of said objects having a parent-child hierarchical relationship, wherein a child object of said objects defines a portion of a parent object;
   generating information links between said first set of objects and said second set of objects on a plurality of different hierarchical levels, said information links describing relationships between said first set of objects .and said second set of objects;
   tracing allocatable requirements between said first set of objects and said second set of objects: and
   maintaining a matrix of interrelations between said information links describing said relationships between said first set of objects and said second set of objects.

2. The method of claim 1, wherein said step of generating information links comprises the step of generating said information links so that a text file is associable with said plurality of said objects.

3. The method of claim 1, wherein said method further comprises the step of linking text files associated with said plurality of objects to produce a document.

4. The method of claim 3, wherein said method further comprises the step of generating a template for describing an organization of said document.

5. The method of claim 1, wherein said method further comprising comprises the step of generating relationships between said objects on a common hierarchical level to test a functionality of the system design on said hierarchical level.

6. The method of claim 1, wherein said step of generating information links includes the step of associating structural requirements to said objects.

7. The method of claim 1, wherein said method and further comprises the step of generating text files associated with a portion of said first set of objects and said second set of objects.

8. The method of claim 1, wherein said step of generating information links includes the step of apportioning allocatable requirements among said first set of objects and said second set of objects.

* * * * *